(12) United States Patent
Elsayed et al.

(10) Patent No.: US 11,171,683 B2
(45) Date of Patent: *Nov. 9, 2021

(54) MULTI-MODE CONFIGURABLE TRANSCEIVER WITH LOW VOLTAGE SWITCHES

(71) Applicant: SHENZHEN GOODIX TECHNOLOGY CO., LTD., Shenzhen (CN)

(72) Inventors: Ayman Mohamed Elsayed, San Diego, CA (US); Ahmed Emira, San Diego, CA (US); Rami H Khatib, San Diego, CA (US); Janakan Sivasubramaniam, San Diego, CA (US); Jared M Gagne, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/131,791

(22) Filed: Dec. 23, 2020

(65) Prior Publication Data

US 2021/0111748 A1 Apr. 15, 2021

Related U.S. Application Data

(63) Continuation-in-part of application No. 16/404,720, filed on May 6, 2019, now Pat. No. 10,911,091, (Continued)

(51) Int. Cl.
*H03K 17/693* (2006.01)
*H04B 1/44* (2006.01)
*H03K 17/687* (2006.01)

(52) U.S. Cl.
CPC .............. *H04B 1/44* (2013.01); *H03K 17/687* (2013.01)

(58) Field of Classification Search
CPC .................................................... H03K 17/693
See application file for complete search history.

(56) References Cited

U.S. PATENT DOCUMENTS 7,944,296 B1 *  5/2011  Lee ........................ H03F 1/0277
                                                 330/195
8,044,540 B2 * 10/2011  Lee ........................ H03K 17/693
                                                 307/115

(Continued)

FOREIGN PATENT DOCUMENTS

CN    1689241 A    10/2005
CN  101656509 A    2/2010

(Continued)

*Primary Examiner* — Cindy Trandai
(74) *Attorney, Agent, or Firm* — Kilpatrick Townsend & Stockton LLP

(57) ABSTRACT

A transceiver includes a receive path including a low noise amplifier and a first switch coupled between the low noise amplifier and ground, a first transmit path including a low power amplifier and a second switch coupled between the low power amplifier and a main signal path, and a second transmit path including a high power amplifier and a third switch coupled between the main signal path and ground. The receive path is active when the first, second, and third switches are in an open position, the first transmit path is active when the first switch is in a closed position, the second switch is in the closed position, and the third switch is in the open position, and the second transmit path is active when the first switch and the third switch are in the closed position, and the second switch is in the open position.

20 Claims, 13 Drawing Sheets

Related U.S. Application Data which is a continuation of application No. 15/952,228, filed on Apr. 12, 2018, now Pat. No. 10,333,579.

(56) References Cited

U.S. PATENT DOCUMENTS

| | | | |
|---|---|---|---|
| 8,115,555 B2* | 2/2012 | An | H03F 3/45475 |
| | | | 330/301 |
| 2002/0151281 A1 | 10/2002 | Izadpanah et al. | |
| 2007/0281629 A1* | 12/2007 | Ahn | H04B 1/48 |
| | | | 455/78 |
| 2009/0209214 A1* | 8/2009 | Harel | H03F 3/72 |
| | | | 455/127.3 |
| 2014/0098579 A1* | 4/2014 | Kleinpenning | H02M 3/33523 |
| | | | 363/21.17 |
| 2015/0194942 A1* | 7/2015 | Anderson | H03F 3/195 |
| | | | 330/295 |
| 2018/0048273 A1* | 2/2018 | Goldblatt | H03F 1/0277 |
| 2019/0089396 A1* | 3/2019 | Kim | H04B 1/3805 |

FOREIGN PATENT DOCUMENTS

| | | |
|---|---|---|
| CN | 203135863 U | 8/2013 |
| CN | 103338050 A | 10/2013 |
| CN | 103986493 A | 8/2014 |
| CN | 106063160 A | 10/2016 |
| EP | 1237222 A1 | 9/2002 |

* cited by examiner

MULTI-MODE CONFIGURABLE TRANSCEIVER WITH LOW VOLTAGE SWITCHES

CROSS-REFERENCES TO RELATED APPLICATIONS

This application is a continuation-in-part of U.S. patent application Ser. No. 16/404,720, filed on May 6, 2019, entitled "MULTI-MODE CONFIGURABLE TRANSCEIVER WITH LOW VOLTAGE SWITCHES," which is a continuation of U.S. Pat. No. 10,333,579, filed on Apr. 12, 2018, entitled "MULTI-MODE CONFIGURABLE TRANSCEIVER WITH LOW VOLTAGE SWITCHES," which are incorporated by reference herein in its entirety.

FIELD OF THE INVENTION

Embodiments of the present invention relate to radio frequency (RF) transceivers, and more particularly to a RF transceiver having different output power configurations.

BACKGROUND OF THE INVENTION

Advances in wireless technology enable wireless communication devices to support signal transmission and reception over multiple frequency bands and communication standards. For example, a cellular phone may be able to communicate using WCDMA, CDMA, GSM, LTE standards for cellular telephony, IEEE 802.11 protocols for wireless LAN, and/or Bluetooth Low Energy (BLE) for piconet wireless communication.

FIG. 1 is a block diagram of a prior art wireless transceiver device 100. Referring to FIG. 1, a radio frequency (RF) input signal 111 is provided to a low power amplifier 110, which outputs an amplified output signal 113 to an antenna 150 through a port 161 of an external switch device 160 for wireless transmission. Transceiver device 100 also includes a high power amplifier 120 which receives an RF input signal 121 and outputs an amplified output signal 123. Transceiver device 100 also includes a balun 125. Output signal 123 is a differential signal coupled to a balun primary winding 125p. Balun 125 transforms the differential signal 123 to a single-ended signal 126 through a secondary winding 125s that is provided to antenna 150 through a port 162 of switch device 160. Transceiver device 100 also includes a low noise amplifier 140 for receiving a RF input signal of antenna 141 through a port 163 of switch device 160. Referring to FIG. 1, switch device 160 may be a four-port device having four ports 161, 162, 163, and 164. Switch device 160 may be implemented utilizing electronic switches such as MOS transistors.

However, an external (i.e., off-chip) switch device may increase the printed circuit board area, power consumption, and the manufacturing costs that are not suitable for high volume and low cost production of wearable wireless devices.

Embodiments of the present invention provide novel solutions to these problems.

BRIEF SUMMARY OF THE INVENTION

An aspect of the present invention provides a wireless transceiver including a receive path having a first switch and configured to receive an input signal when the first switch is in an open position, a first transmit path having a second switch and configured to provide a first output signal when the second switch is in a closed position and the first switch is in a closed position, and a second transmit path having a third switch and configured to provide a second output signal when the third switch is in a closed position, the first switch is in the closed position, and the second switch is in an open position. The first, second, and third switches are integrated together with the receive path, the first RF transmit path, and the second transmit path within a same integrated circuit.

Another aspect of the present invention provides a configurable transceiver having a receive path comprising a low noise amplifier (LNA) having an input terminal coupled to an antenna, a first switch being coupled to the input terminal of the LNA and a ground potential, a first transmit path comprising a low power amplifier having an output terminal coupled to the antenna through the second switch, and a second transmit path comprising a high power amplifier having an output terminal coupled to a balun having a primary winding and a secondary winding, a third switch is coupled between an end terminal of the secondary winding and a ground potential.

For example, embodiments can include a receive path coupled with an antenna interface configured to couple with an off-chip antenna, the receive path selectively coupled with a ground reference via a first switch (e.g., the receive path has a low-noise amplifier (LNA), an input of the LNA being coupled with the off-chip antenna interface, and selectively coupled with the ground reference via the first switch); a first transmit path including a low power amplifier (LPA) having a LPA output selectively coupled with the antenna interface via a second switch and a DC blocking capacitor; and a second transmit path including a high power amplifier (HPA) coupled with a primary winding of a balun having a secondary winding inductively coupled with the primary winding, a first side of the secondary winding coupled with the antenna interface, and a second side of the secondary winding coupled with the ground reference, the secondary winding selectively activated via a third switch. In such embodiments, a receive mode is active when the first switch is deactivated, the second switch is deactivated, and the third switch is deactivated; a low-power transmit mode is active when the first switch is activated, the second switch is activated, and the third switch is deactivated; and a high-power transmit mode is active when the first switch is activated, the second switch is deactivated, and the third switch is activated. In some such embodiments a logic circuit is included selectively to reconfigure between the receive mode, the low-power transmit mode, and the high-power transmit mode by generating control signals selectively to activate or deactivate at least the first, second, and third switches. In some such embodiments, the LPA output is further selectively coupled with a DC bias circuit via a fourth switch; and the fourth switch is activated at least when the high-power transmit mode is active.

In some such embodiments, the receive path, the LPA, the HPA, the balun, and the antenna interface are disposed on an integrated circuit chip; the receive path further comprises a capacitor coupled between the ground reference and the first switch; the receive path and the output of the LPA are coupled with a first node of the antenna interface; the first side of the secondary winding coupled with a second node of the antenna interface separate from the first node of the antenna interface; and the second switch, the DC blocking capacitor, and the third switch are disposed in an off-chip component coupled with the first and second nodes of the antenna interface.

In some such embodiments, the receive path, the first transmit path, the second transmit path, and the antenna interface are disposed on an integrated circuit chip; the receive path is coupled with a first node of the antenna interface; the first transmit path and the second transmit path are coupled with a second node of the antenna interface separate from the first node of the antenna interface. For example, a very-high power transmit mode can be implemented by including an off-chip power amplifier having an input coupled with the second node of the antenna interface and an output configured to couple with the off-chip antenna.

In some such embodiments, the LPA comprises a first LPA and a second LPA. The first LPA has a first LPA output selectively coupled with the antenna interface via the second switch and the DC blocking capacitor, and selectively coupled with a first side of the primary winding of the balun via a fourth switch. The second LPA has a second LPA output selectively coupled with a second side of the primary winding of the balun via a fifth switch. In such a configuration, the low-power transmit mode is active when the first switch is activated, the second switch is activated, the third switch is deactivated, the fourth switch is deactivated, and the fifth switch is deactivated. In some implementations, a medium-power transmit mode is active when the first switch is activated, the second switch is deactivated, the third switch is activated, the fourth switch is activated, and the fifth switch is activated. For example, in the medium-power transmit mode, the first LPA and the second LPA are configured to receive a differential input signal (i.e., input signals going to each LPA are complements of each other). In some implementations, a battery voltage reference node coupled with a center tap on the primary winding of the balun via a sixth switch, wherein the sixth switch is deactivated in the receive mode, the sixth switch is deactivated in the low-power transmit mode, and the sixth switch is activated in the high-power transmit mode.

Some such embodiments further include a sixth switch, a seventh switch, and an eighth switch. In such embodiments, the primary winding of the balun comprises a first primary winding and a second primary winding, both inductively coupled with the secondary winding, the first side of the primary winding corresponding to a first side of the first primary winding, and the second side of the primary winding corresponding to a second side of the second primary winding, the sixth switch is coupled between a second side of the first primary winding and a first side of the second primary winding, the seventh switch is coupled between the first side of the first primary winding and the first side of the second primary winding, and the eighth switch is coupled between the second side of the first primary winding and the second side of the second primary winding. The balun is configurable to operate in a normal mode by activating the sixth switch, deactivating the seventh switch, and deactivating the eighth switch, such that the first and second primary windings are connected in series, and the balun is configurable to operate in a high-power mode by deactivating the sixth switch, activating the seventh switch, and activating the eighth switch, such that the first and second primary windings are connected in parallel.

Yet another aspect of the present invention provides a method of configuring a wireless transceiver comprising a receive path having a first switch, a first transmit path having a second switch, and a third transmit path having a third switch. The method may include selecting the receive path by setting the first switch in an open position, the second switch in the open position, and the third switch in the open position, selecting the first transmit path by setting the first switch in a closed position, the second switch in the closed position, and the third switch in the open position, and selecting the second transmit path by setting the first switch in a closed position, the second switch in the open position, and the third switch in the closed position.

For example, such methods can operate in context of a transceiver comprising an antenna interface configured to couple with an off-chip antenna, a receive path coupled with the antenna interface and selectively coupled with a ground reference via a first switch, a first transmit path including a low power amplifier (LPA) having a LPA output selectively coupled with the antenna interface via a second switch and a DC blocking capacitor, and a second transmit path including a high power amplifier (HPA) coupled with a primary winding of a balun having a secondary winding inductively coupled with the primary winding, a first side of the secondary winding coupled with the antenna interface, and a second side of the secondary winding coupled with the ground reference, the secondary winding selectively activated via a third switch. In such contexts, the method can include configuring the transceiver to operate in a selected one of a plurality of operating modes by generating control signals to selectively activate or deactivate each of the first switch, the second switch, and the third switch, such that: the transceiver is configured to operate in a receive mode of the plurality of operating modes by generating the control signals to deactivate the first switch, to deactivate the second switch, and to deactivate the third switch; the transceiver is configured to operate in a low-power transmit mode of the plurality of operating modes by generating the control signals to activate the first switch, to activate the second switch, and to deactivate the third switch; and the transceiver is configured to operate in a high-power transmit mode of the plurality of operating modes by generating the control signals to activate the first switch, to deactivate the second switch, and to deactivate the third switch.

In some such embodiments, the LPA output is further selectively coupled with a DC bias circuit via a fourth switch; and the transceiver is configured to operate in the high-power transmit mode of the plurality of operating modes by generating the control signals further to activate the fourth switch. In some such embodiments, the receive path is coupled with a first node of the antenna interface; the first transmit path and the second transmit path are coupled with a second node of the antenna interface separate from the first node of the antenna interface by at least a set of off-chip switches; the transceiver further includes an off-chip power amplifier having an input coupled with the second node of the antenna interface and an output configured to couple with the off-chip antenna; and the configuring is, such that the transceiver is further configured to operate in a very-high-power transmit mode of the plurality of operating modes by generating the control signals to activate the first switch, to deactivate the second switch, and to deactivate the third switch, and to activate the off-chip power amplifier.

In some such embodiments, the LPA comprises a first LPA and a second LPA; the first LPA has a first LPA output selectively coupled with the antenna interface via the second switch and the DC blocking capacitor, and selectively coupled with a first side of the primary winding of the balun via a fourth switch; the second LPA has a second LPA output selectively coupled with a second side of the primary winding of the balun via a fifth switch. The transceiver is configured to operate in the low-power transmit mode of the plurality of operating modes by generating the control signals to activate the first switch, to activate the second switch, to deactivate the third switch, to deactivate the fourth switch, and to deactivate the fifth switch. In some embodiments, the configuring is, such that the transceiver is further configured to operate in a medium-power transmit mode of the plurality of operating modes by generating the control signals to activate the first switch, to deactivate the second switch, to activate the third switch, to activate the fourth switch, and to activate the fifth switch. In some implementations, in the medium-power transmit mode, the first LPA and the second LPA are configured to receive a differential input signal. In some implementations, the transceiver further comprises a battery voltage reference node coupled with a center tap on the primary winding of the balun via a sixth switch; and the configuring is such that the sixth switch is deactivated in the receive mode, the sixth switch is deactivated in the low-power transmit mode, and the sixth switch is activated in the high-power transmit mode.

Some such embodiments further include selectively configuring the balun to operate in one of a normal mode or a high-power mode. For example, the primary winding of the balun comprises a first primary winding and a second primary winding, both inductively coupled with the secondary winding. Selectively configuring the balun to operate in the normal mode comprises switchably coupling the first and second primary windings to be connected in series; and selectively configuring the balun to operate in the high-power mode comprises switchably coupling the first and second primary windings to be connected in parallel.

The following description, together with the accompanying drawings, will provide a better understanding of the nature and advantages of the claimed invention.

BRIEF DESCRIPTION OF THE DRAWINGS

The accompanying drawings, which are incorporated in and constitute a part of the specification, illustrate embodiments of the present invention. The like reference labels in various drawings refer to the like elements.

DETAILED DESCRIPTION OF THE INVENTION

The present invention will be understood more fully from the detailed description given below and from the accompanying drawings of the preferred embodiments of the invention, which, however, should not be taken to limit the invention to the specific embodiments, but are for explanation and understanding only. The embodiments are described in sufficient detail to enable one of skill in the art to practice the invention. Other embodiments may be utilized and structural, logical, and electrical changes may be made without departing from the scope of the present invention.

It will be understood that, when an element or component is referred to as "adjacent to," "connected to," or "coupled to" another element or component, it can be directly adjacent to, connected or coupled to the other element or 1 component, or intervening elements or components may also be present. In contrast, when an element is referred to as being "directly connected to," or "directly coupled to" another element or component, there are no intervening elements or components present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items. As used herein, the term "radio frequency", "RF," and "wireless" are interchangeably used.

Figure 1:
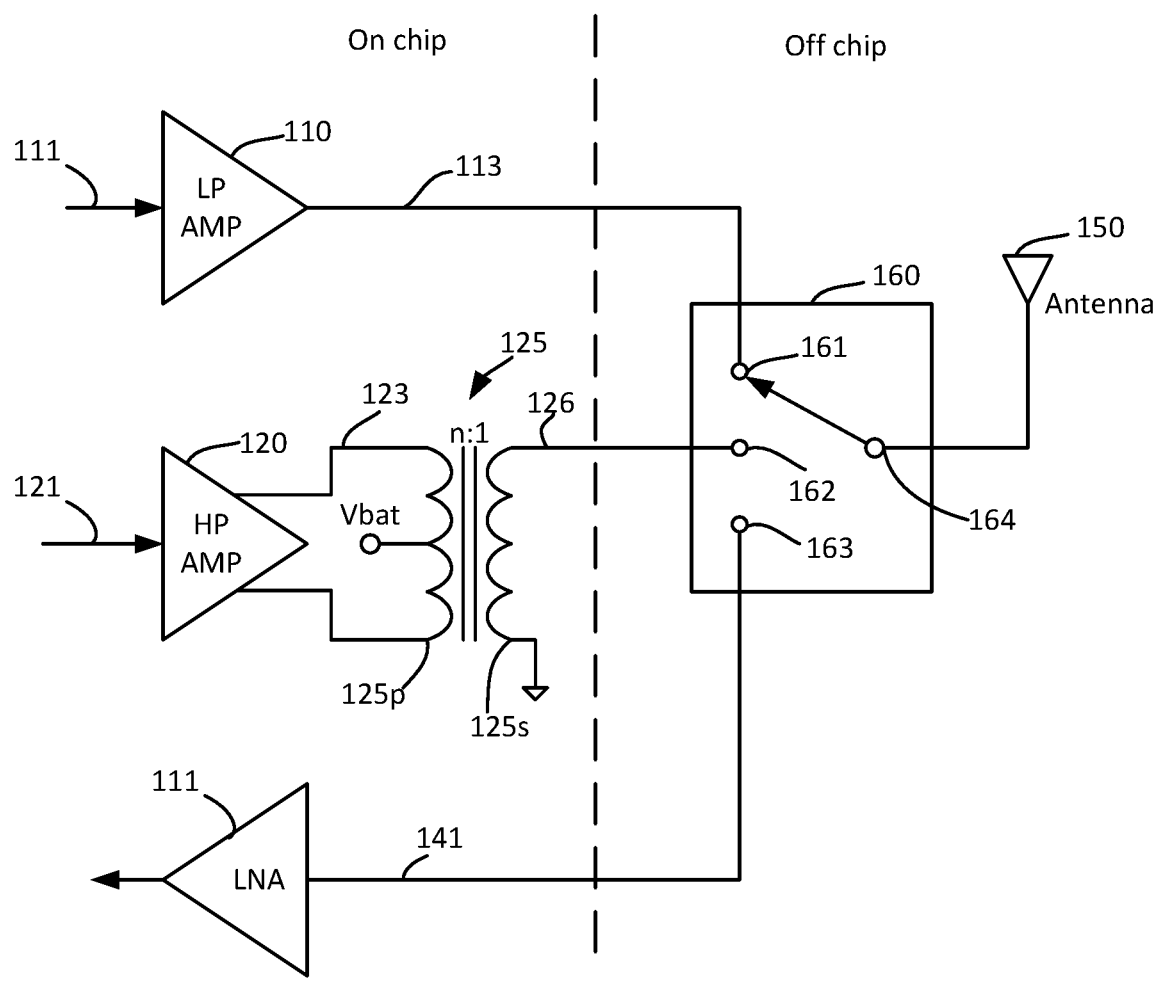
FIG. 1 is a block diagram of a prior art wireless transceiver device.
Figure 2:
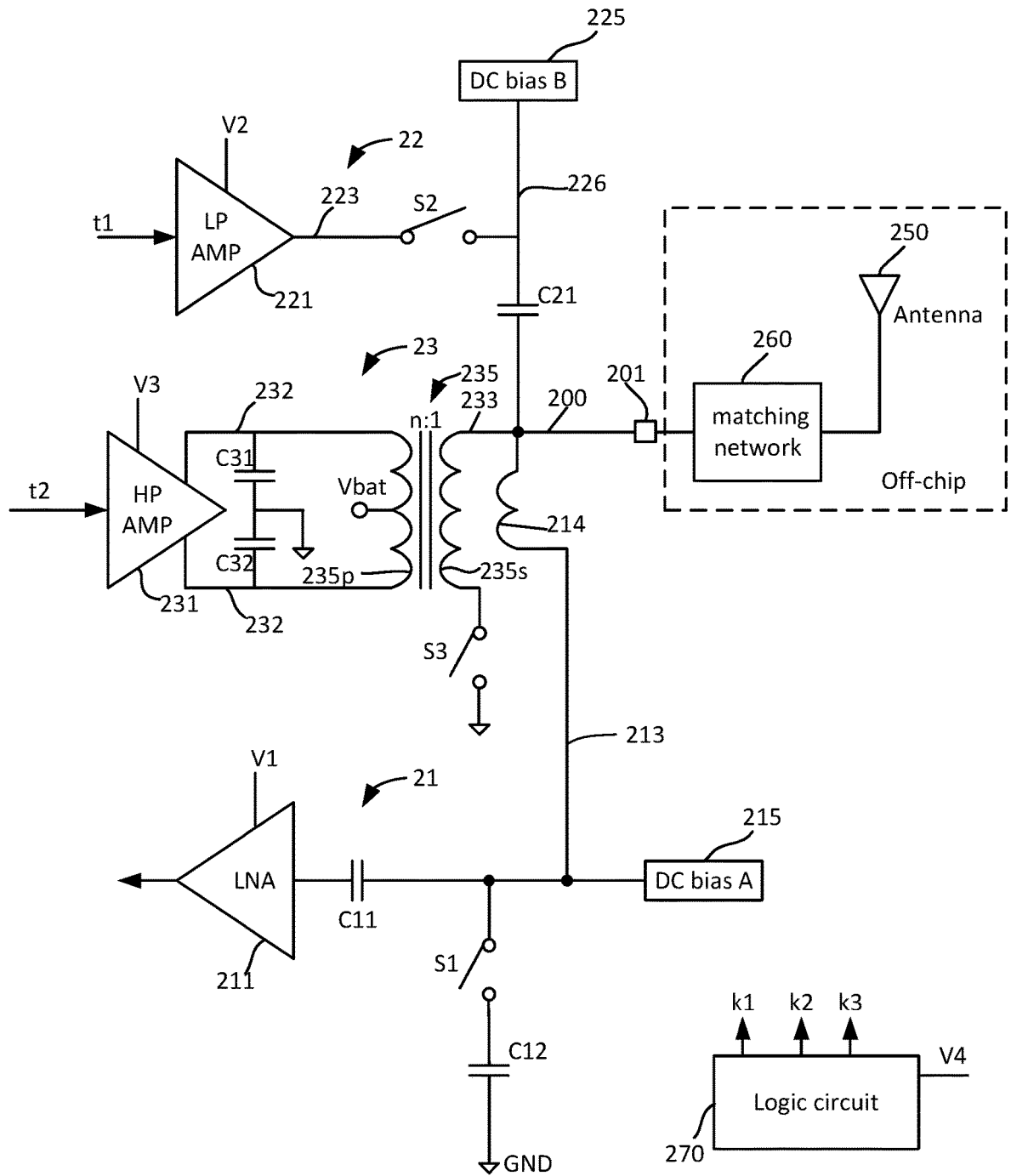
FIG. 2 is a block diagram of a radio frequency (RF) transceiver according to an embodiment of the present invention.

FIG. 2 is a block diagram of a radio frequency (RF) transceiver 20 according to an embodiment of the present invention. Referring to FIG. 2, transceiver 20 may include a receive path 21, a first RF transmit path 22, and a second transmit path 23. Transceiver 20 may further include a logic circuit 270 configured to provide control signals to activate or deactivate receive path 21, first RF transmit path 21, and second transmit path 23. Receive path 21, first RF transmit path 22, and second transmit path 23 are connected to each other by a main signal path 200 that may terminate at a node 201. Node 201 may be a pin, pad, or bump of an integrated circuit and coupled to an external (off-chip) antenna 250 via an external matching network 260.

Receive path 21 may include a low noise amplifier (LNA) 211 configured to receive a RF input signal 213 from antenna 250 through an ac coupling capacitor C11. Receive path 21 may also include a first switch S1 coupled between one end of coupling capacitor C11 and one end of a first DC block capacitor C12. First DC block capacitor C12 has another end coupled to a ground potential GND. Receive path 21 may further include a direct current (DC) bias circuit A 215 configured to provide a bias voltage to LNA 211. In one embodiment, LNA 211 may have an internal DC bias circuit, in this case DC bias circuit 215 may be omitted. In one embodiment, receive path 21 may also include an LNA impedance matching inductor 214.

First RF transmit path 22 may include a low power amplifier (LP AMP) 221, a second switch S2, and a second DC block capacitor C21 having one end coupled to main signal path 200 and another end coupled to one end of second switch S2. Second switch S2 has another end coupled to an output of LP AMP 221. LP AMP 221 receives an RF first input signal t1 and provides an amplified output signal 223. First RF transmit path 22 may further include a second DC bias circuit B 225 coupled to second switch S2 and configured to provide a DC bias voltage 226 to output signal 223 when second switch S2 is in a closed position. Bias voltage 226 is blocked by DC block capacitor C21 so that only output signal 223 reaches main signal path 200. In one embodiment, the low power amplifier may have an internal bias voltage or current so that DC bias circuit B 225 may be omitted.

Second RF transmit path 23 may include a high power amplifier (HP AMP) 231 and a balun 235 having a primary winding 235$p$ and a secondary winding 235$s$. Primary winding 235$p$ has a tap connected to a power supply Vbat. Secondary winding 235$s$ is electromagnetically coupled to primary winding 235$p$ and has one end coupled to main signal path 200 and another end coupled to the ground potential GND through a third switch S3. HP AMP 231 is configured to receive a signal t2 and output an amplified differential output signal 232 to balun 235. Balun 235 is configured to convert differential signal 232 to a single-ended signal 233 and provide to node 201. In one embodiment, single-ended signal 233 of secondary winding 235$s$ of balun 235 can directly drive antenna 250 without an additional power amplification stage.

In one embodiment, transceiver 20 may further includes two switchable capacitors C31, C32 coupled in parallel to primary winding 235$p$ in order to obtain s switchable high input impedance of balun 235.

In one embodiment, transceiver 20 may also include an off-chip matching network 260 coupled between node 201 and antenna 250. Matching network 260 is configured to match an output impedance of HP AMP 231 to an impedance of a load, i.e., antenna 250.

In some embodiments, receive path 21 has a first power supply voltage V1, first transmit path 22 has a second power supply voltage V2, and second transmit path 23 has a third power supply voltage V3. Transceiver 20 may be an integrated circuit having a core region that is supplied by a fourth supply voltage V4. For example, the core region may include core transistors and pass gate transistors that are operating at the fourth supply voltage V4. First transmit path 22 and second transmit path 23 each may have transistors in the peripheral region of the integrated circuit, the transistors in the peripheral region may have a gate oxide layer thickness thicker than the gate oxide thickness of the transistors of the receive path. In one embodiment, V4<V1<V2<V3. For example, the supply voltage V4 of the core region including logic circuit 270 may be about 0.9V, the supply voltage V1 of the receive path including the LNA may be in the range between 1.0V and 1.2V, the supply voltage V2 of the first transmit path including the LP AMP may be about 1.8V, and the supply voltage V3 of the second transmit path including the HP AMP may be about 3.3V. In one embodiment, the voltage Vbat applied to the center tap of the primary winding of the balun is about 3.3V, i.e., the same as V3.

As used herein, low voltage MOS transistors (e.g., FETs) are referred to as transistors having a thin gate oxide layer (on the order of 2.6 nm thick), whereas high voltage FET are referred to transistors that are fabricated with a thicker gate oxide (on the order of 5.6 nm thick). Additionally, the high voltage FETs have a longer channel length of 250 nm or more, vs. 40 nm for a low voltage FET (in 40 nm process). Low voltage FETs (also referred to as core FETs) constitute the largest portion of the chip functionality. High voltage FETs (also referred to as IO FETs) are predominantly used for Input and Output (IO) signals. The low voltage FET has a far superior Figure of Merit, defined as FOM=RDS×CGS (lower is better); lower on-resistance and lower parasitic capacitance. It is highly favorable to implement a switch using a low voltage FET provided it can be assured that it remains within its safe operating voltage.

Switches S1 and S3 are low voltage n-type field effect transistors (nFETs) whereas switch S2 is a high voltage IO n-type field effect transistors (nFET). In the following, a switch being in a closed (open) positon is referred to as the nFET is in a "turned on" or "conducting" ("turned off" or "non-conducting") state.

Logic circuit 270 is configured to generate control signals to set switches S1, S2, and S3 to their respective positions, e.g., closed position, and open position. Logic circuit 270 may include digital logic gates (e.g., inverters, NAND, NOR, and/or XOR gates) or a microcontroller, microprocessor, programmable logic array, and/or field programmable logic.

Transceiver 20 may be operated in a variety of operating modes. In one embodiment, transceiver 20 may be operated in a receive mode. In the receive mode, logic circuit 270 provides a first control signal k1 to set (actuate) first switch S1 to an open position, a second control signal k2 to set second switch S2 to the open position, and a third control signal k3 to set third switch to the open position. In one embodiment, transceiver 20 may be operated in a first transmission mode. In the first transmission mode, logic circuit 270 provides first control signal k1 to set first switch S1 to a closed position, second control signal k2 to set second switch S2 to the closed position, and third control signal k3 to set third switch to the open position. In one embodiment, transceiver 20 may be operated in a second transmission mode. In the second transmission mode, logic circuit provides first control signal k1 to set first switch S1 to the closed position, second control signal k2 to set second switch S2 to the open position, and third control signal k3 to set third switch to the closed position.

These configurations of the transceiver have important advantages in terms of electrical performance and high level of integration. As explained in the background section, a high drain-to-source voltage could exceed the breakdown voltage of the transistors used for S1 and S3. Therefore, both the first switch (e.g., nFET) S1 and the third switch (e.g., nFET) S3 are in the open position when the high power transmit path is not in use. When the high power transmit path is in use, the first switch S1 and the third switch S3 (nFET) are conducting, lowering the risk of a breakdown of the nFETs.

It will be appreciated by those of ordinary skill in the art that the components in first transmit path 22 and second transmit path 23 are shown for illustrative purpose only, and that first transmit path 22 and second transmit path 23 may be implemented using any alternative architectures. For example, the low power amplifier and the high power amplifier in the respective first transmit path and the second transmit path may have one or more amplification stages. The configurations and techniques of the present invention can be applied to such alternative architectures.

In one embodiment, input signal 213 to LNA 211 is a single-ended signal, output signal 223 provided at an output of LP AMP 221 is a single-ended output signal, and output signal 232 provided at an output of HP AMP 231 is a differential signal. In one embodiment, LNA 211 is supplied with a first supply voltage V1, LP AMP 221 is supplied with a second supply voltage V2, HP AMP 231 is supplied with a third supply voltage V3, and logic circuit 270 is supplied with a second supply voltage V4. In one embodiment, V4<V1<V2<V3. In one embodiment the voltage Vbat at the center tap of primary winding 235p of balun 235 is equal to V3.

Figure 2A:
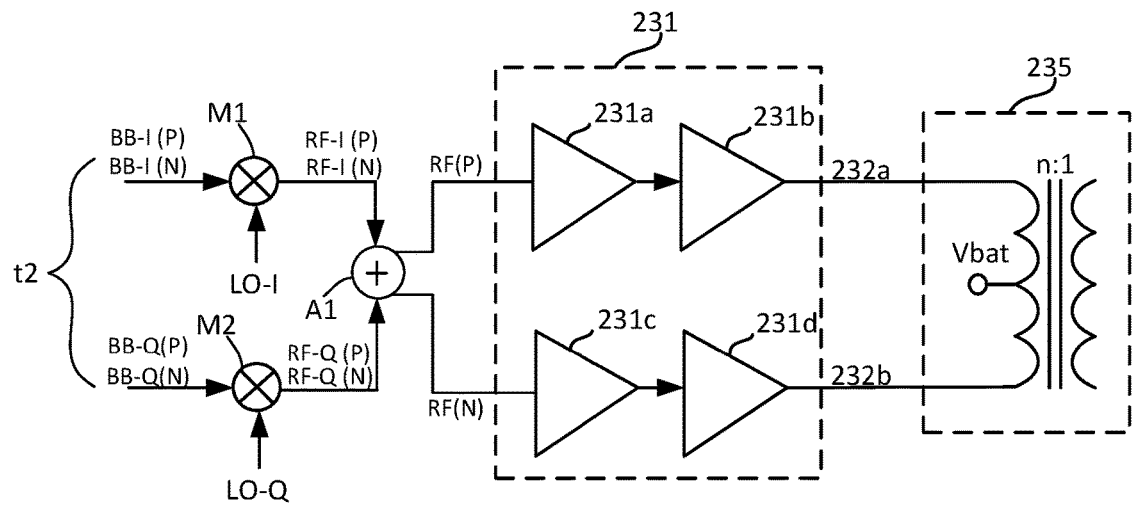
FIG. 2A is a block diagram of a transmit signal of the second transmit path according to an exemplary embodiment of the present invention.

FIG. 2A is a block diagram of a transmit signal of the second transmit path according to an exemplary embodiment of the present invention. Referring to FIG. 2A, a t2 signal may include an input baseband signal BB-I (in-phase) and an input baseband signal BB-Q (quadrature-phase) provided to respective mixers M1 and M2 which up-convert the BB-I and BB-Q baseband signals to respective radio frequency (RF) signals RF-I and RF-Q by multiplying them with respective local oscillator signals LO-I and LO-Q. The up-converted RF signals RF-I and the RF-Q are then summed at an adder A1, and the summed signals are provided to HP AMP 231. It is noted that the baseband signals may be differential signals that are mixed with differential local oscillator frequency signals. The summed signals are also differential signals that are provided to HP AMP 231. In one example embodiment, HP AMP 231 may include a pre-driver 231a and an amplifier 231b, and a pre-driver 231c and an amplifier 231d. Positive and negative differential signal outputs of adder A1 are coupled to respective pre-drivers 231a and 231c. Amplifiers 231b and 231d increase the pre-amplified output signals of pre-drivers 231a, 231b to the required power level by the wireless standard to deliver differential signals 232a, 232b to balun 235.

Figure 2B:
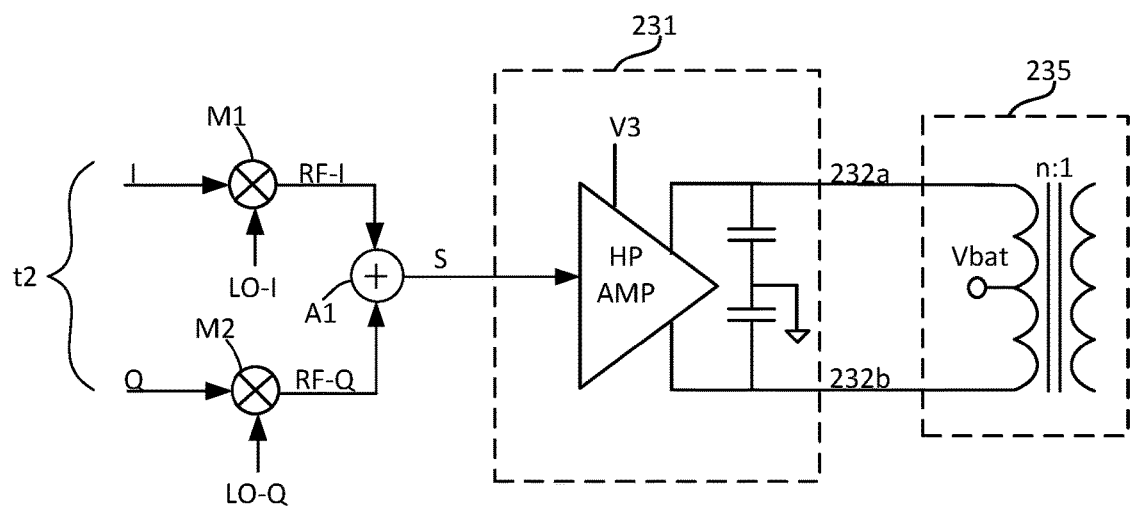
FIG. 2B is a block diagram of a transmit signal of the second transmit path according to another exemplary embodiment of the present invention.

FIG. 2B is a block diagram of a transmit signal of the second transmit path according to another exemplary embodiment of the present invention. Referring to FIG. 2B, a t2 signal may include an in-phase signal I and a quadrature-phase signal Q that are frequency up-converted to respective RF-I and RF-Q by respective mixers M1 and M2. The frequency up-converted RF-I and the RF-Q signals are summed at an adder A1 to a real signal S, which is then applied to HP AMP 231. In one embodiment, the real signal S may be a single-ended signal. In other embodiment, the real signal S is a differential signal. HP AMP 231 provides than a differential signal 232a, 232b to balun 235.

Figure 3A:
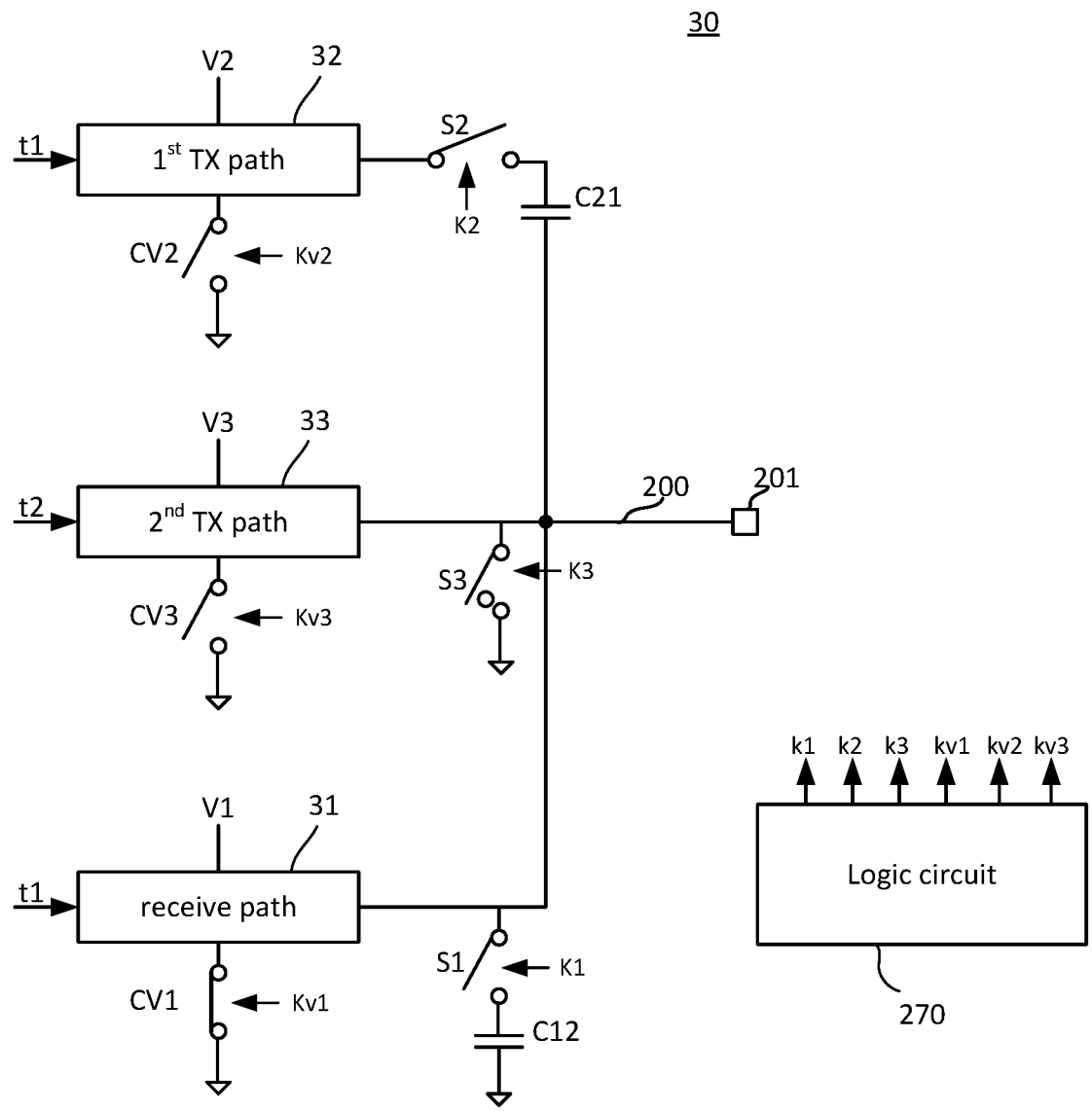
FIG. 3A is a simplified block diagram illustrating a receive operation of a transceiver 30 according one embodiment of the present invention.

FIG. 3A is a simplified block diagram illustrating a receive operation of a transceiver 30 according one embodiment of the present invention. Referring to FIG. 3A, transceiver 30 may have a similar implementation as transceiver 20 of FIG. 2. Transceiver 30 may include a receive path 31 that is supplied with a first power supply voltage V1, and a first switch S1 coupled between an input terminal of receive path 31 (e.g., an input of LNA 211) and GND via capacitor C12. Transceiver 30 may also include a first transmit path 32 that is supplied with a second power supply voltage V2, and a second switch S2 coupled between an output of first transmit path 32 (e.g., an output of LP AMP 221) and main signal path 200 via capacitor C21. Transceiver 30 may also include a second transmit path 33 that is supplied with a third power supply voltage V3, and a third switch S3 coupled between an output of second transmit path 33 (e.g., an output of HP AMP 231) and GND. During the receive operation, first switch S1 is in an open position, second switch S2 is in the open position, and third switch S3 is in the open position. The power supply voltages V1, V2, V3 may be disconnected from the respective receive path, the first transmit path, and the second transmit path through associated switches CV1, CV2, and CV3 depending on the operational modes of transceiver 30. Transceiver 30 may include logic circuit 270 configured to generate a plurality of control signals to set the operation modes of transceiver 30. Accordingly, logic circuit 270 generates control signals k1, k2, and k3 to set switches S1, S2, and S3 to their respective positions, e.g., closed position, and open position to set transceiver 30 to the desired operation mode (e.g., receive mode, first signal transmission using the first transmit path, and second signal transmission using the second transmission path). Logic circuit 270 may also be configured to generate control signals (e.g., kv1, kv2, kv3) to connect and disconnect the power supply voltages to the corresponding receive path, the first transmit path, and the second transmit path through respective switches CV1, CV2, and CV3. It is noted that switches CV1, CV2, and CV3 may also be arranged between the respective power supply voltages V1, V2, and V3 and turned on or off by the respective control signals kv1, kv2 and kv3. In one embodiment, during the receive operation, switches S1, S2, and S3 are in the open position, and switch CV1 is in the closed position, and switches CV2 and CV3 are in the open position.

Figure 3B:
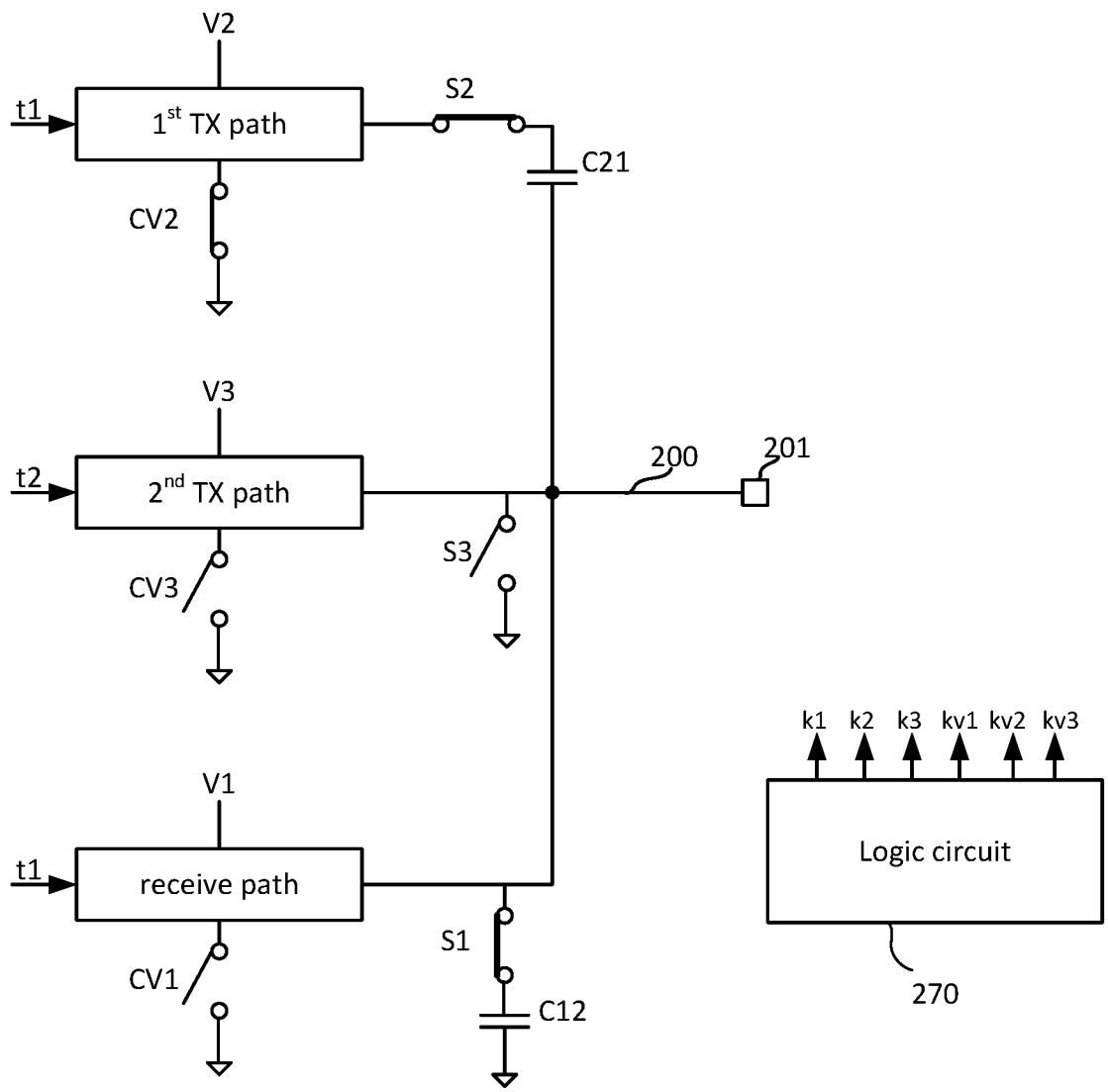
FIG. 3B is a simplified block diagram illustrating a first transmit operation of a transceiver according one embodiment of the present invention.

FIG. 3B is a simplified block diagram illustrating a first transmit operation of transceiver 30 according one embodiment of the present invention. FIG. 3B is the same as FIG. 3A with the exception that transceiver 30 is now in the first transmit operation where the first transmit path is active, and the second transmit path and the receive path are inactive. During the first transmit operation, first switch S1 is in a closed position, second switch S2 is in the closed position, and third switch S3 is in the open position. In one embodiment, during the first transmit position, switches CV2 is in the closed position, and switches CV1 and CV3 are in the open position.

Figure 3C:
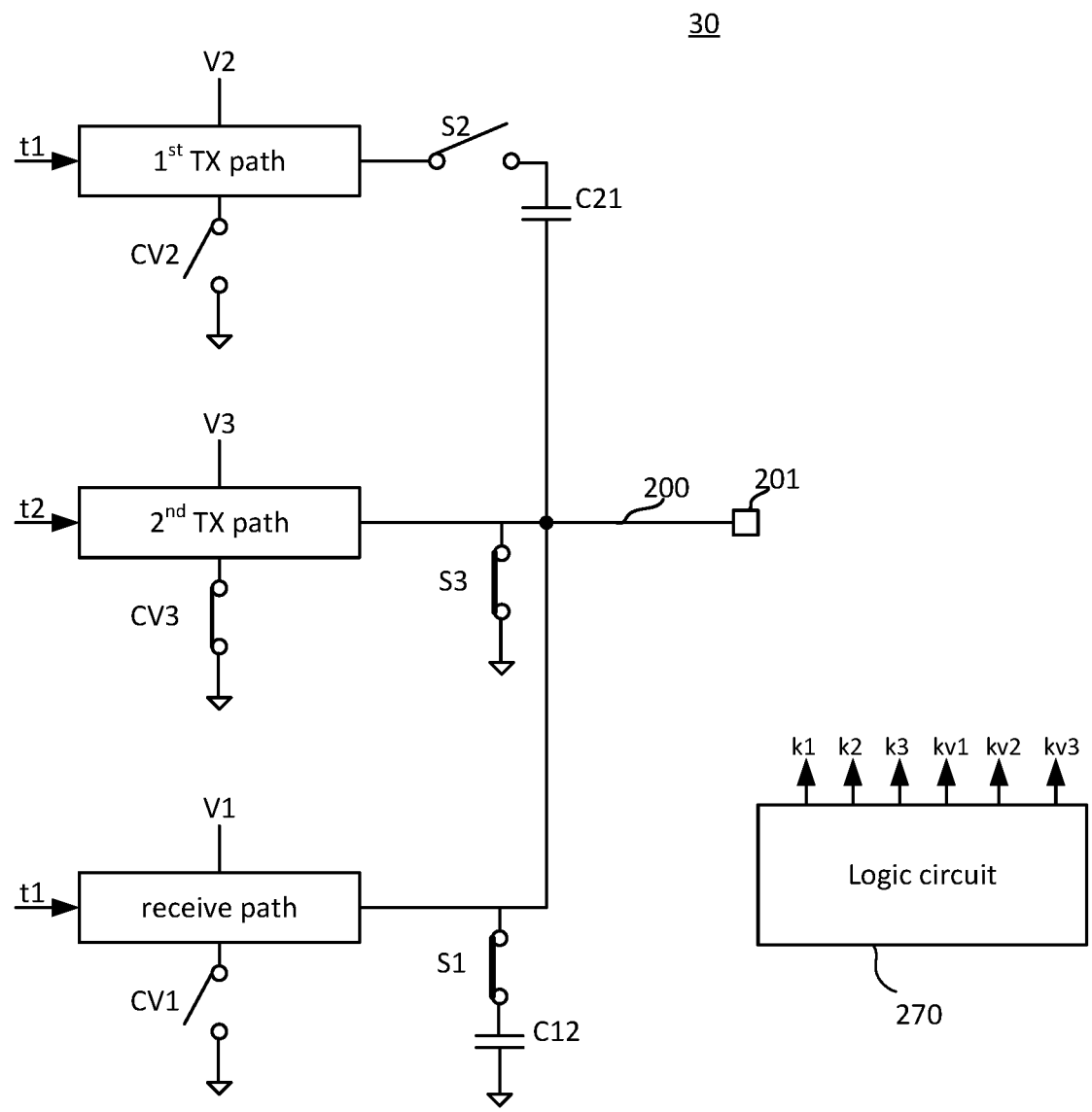
FIG. 3C is a simplified block diagram illustrating a second transmit operation of a transceiver according one embodiment of the present invention.

FIG. 3C is a simplified block diagram illustrating a second transmit operation of transceiver 30 according one embodiment of the present invention. FIG. 3C is the same as FIG. 3A with the exception that transceiver 30 is now in the second transmit operation where the second transmit path is active, and the first transmit path and the receive path are inactive. During the second transmit operation, first switch S1 is in a closed position, second switch S2 is in the open position, and third switch S3 is in the closed position. In one embodiment, during the second transmit operation, switch CV1 and CV2 are in the open position, and switch CV3 is in the closed position.

It is understood that the number of transmission paths and the number of receive paths can be any integer number. In the example embodiments shown in FIG. 2 and FIGS. 3A through 3C, the RF transceiver includes two transmit paths (low power transmit path and high power transmit path) and one receive path. But it is understood that the number of transmit paths and the number of receive path are arbitrarily chosen for describing the example embodiment and should not be limiting.

Figure 4:
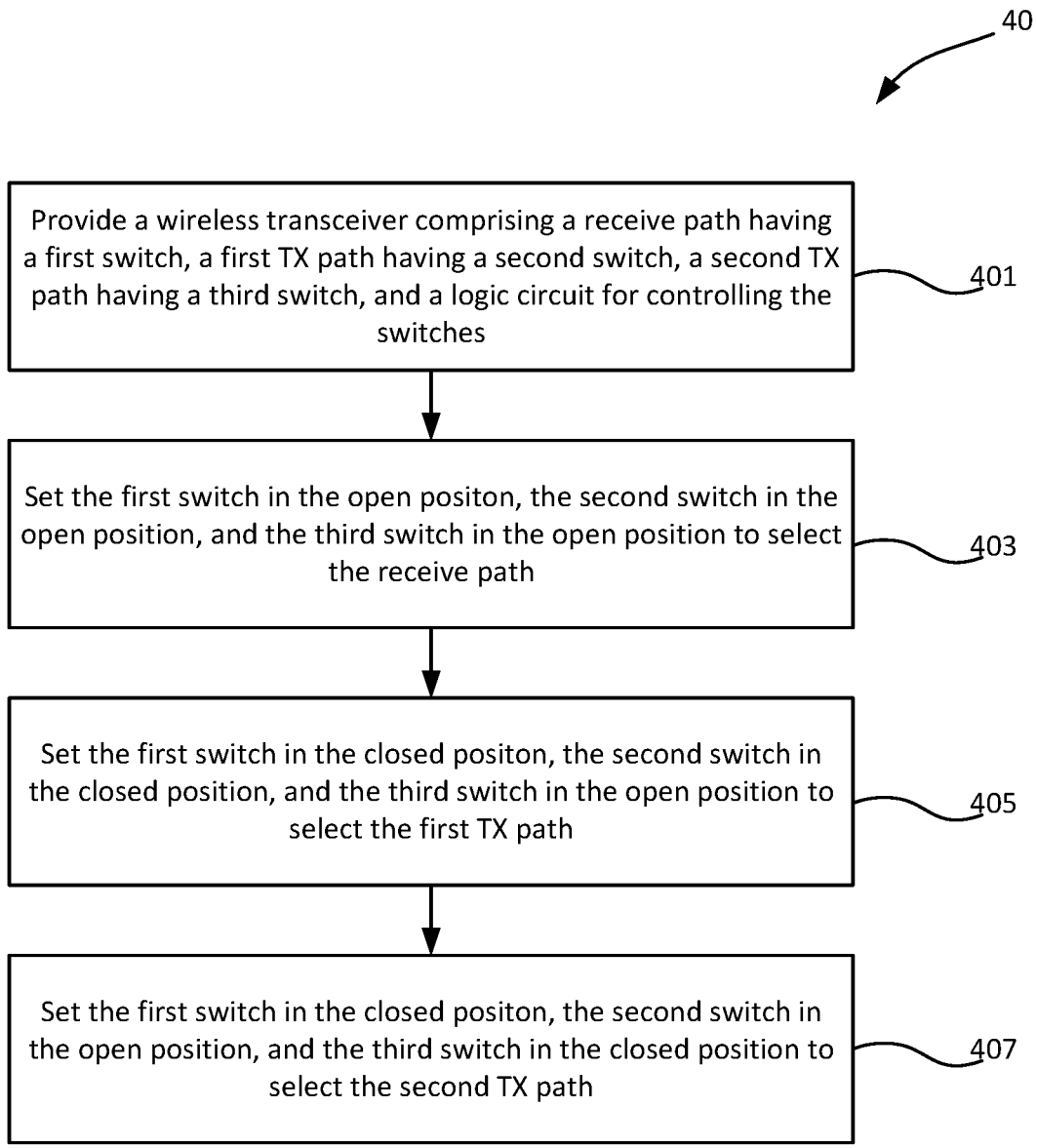
FIG. 4 is a simplified flow chart of a method for operating a RF transceiver according to an embodiment of the present invention.

FIG. 4 is a simplified flow chart of a method 40 for operating a RF transceiver according to an embodiment of the present invention. It is understood that method 40 is only illustrative and not intended to limit the scope of the present invention to any embodiment shown.

Referring to FIG. 4, method 40 may include, at step 401, providing a configurable radio frequency (RF) transceiver comprising a receive path having a first switch, a first transmit path having a second switch, and a second transmit path having a third switch, and a logic circuit configured to generate control signals to set the switches to an open position or a closed position. The receive path includes a low noise amplifier, the first transmit path includes a low power amplifier, and the second transmit path includes a high power amplifier. The first, second, and third switches integrated together with the receive and first and second transmit paths within a same integrated circuit. Method 40 may include selecting one of the receive path, the first transmit path, and the second transmit path. At step 403, when the receive path is desired and selected, method 40 includes setting the first switch in the open position, the second switch in the open position, and the third switch in the open position. That is, during the receive operation, the first, second, and third switches are open. In one embodiment, the power supply voltages to the respective first transmit path and the second transmit paths are disconnected through respective switches. In one embodiment, the switches are low voltage n-type MOS field effect transistors (nMOSFET) that are turned off.

At step 405, when the first transmit path is desired and selected, method 40 includes setting the first switch in the closed position, the second switch in the closed position, and the third switch in the open position. That is, during the transmission operation with the first transmit path, the first switch and the second switch are closed (the associated FETs are turned on), and the third switch is open (the associated FET is turned off).

At step 407, when the second transmit path is desired and selected, method 40 includes setting the first switch in the closed position, the second switch in the open position, and the third switch in the closed position. That is, during the transmission operation with the second transmit path, the first switch is closed (the associated FET is turned on), the second switch is open (the associated FET is turned off), and the third switch is closed (the associated FET is turned on).

Figure 5:
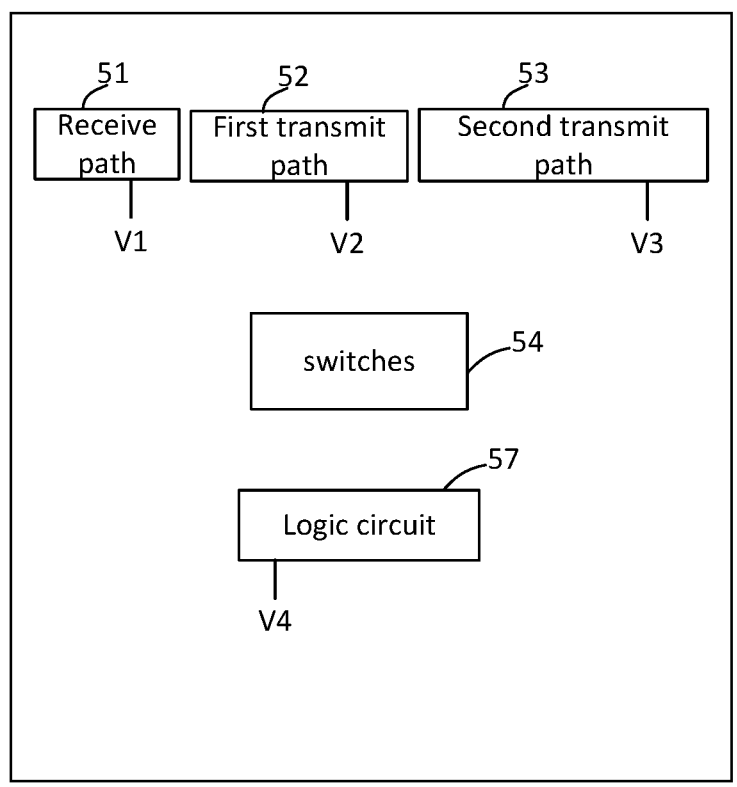
FIG. 5 is a plan view of an example layout of a multimode wireless transceiver according to an embodiment of the present invention.

FIG. 5 is a plan view of an example layout of a multi-mode wireless transceiver device 50 according to an embodiment of the present invention. Referring to FIG. 5, wireless transceiver device 50 may include a receive path 51, a first transmit path 52, and a second transmit path 53. Receive path 51 may include a low noise amplifier LNA and a first switch, first transmit path 52 may include a low power amplifier LP AMP and a second switch, and second transmit path 53 may include a high power amplifier HP AMP, a balun, and a third switch, as described in the sections above in connection with FIGS. 2, 2A, 2B, and FIGS. 3A through 3C. In one embodiment, receive path 51 receives a power supply voltage V1, first transmit path 52 receives a power supply voltage V2, third transmit path receives a power supply voltage V3, and logic circuit 57 receives a power supply voltage V4. In one embodiment, V4<V1<V2<V3. In one example embodiment, the supply voltage V4 of the core region including logic circuit 270 may be about 0.9 to 1V, the supply voltage V1 of the receive path including the LNA may be 1-1.1V, the supply voltage V2 of the first transmit path including the LP AMP may be about 1.8V, the supply voltage V3 of the second transmit path including the HP AMP may be about 3.3V, and the supply voltage of the logic circuit is about 1V and level shifted where needed. In one embodiment, the logic circuit is configured to generate control signals for enabling or disabling the receiving and transmitting functions of the transceiver as described in the above sections.

Figure 6:
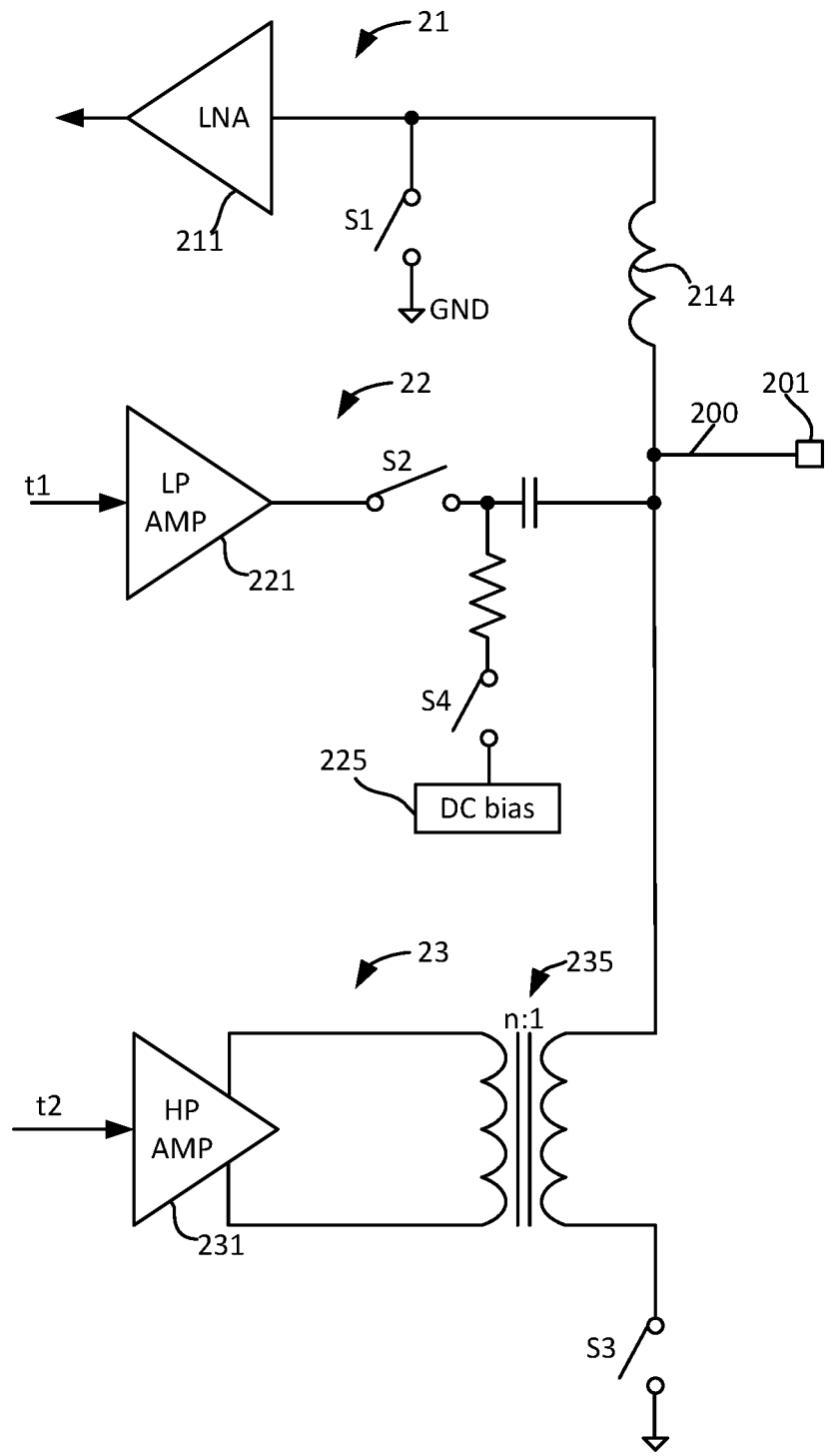
FIG. 6 shows an RF transceiver, which can represent a simplified implementation or illustration of the RF transceiver circuit of FIG. 2.

FIGS. 6-10 provide additional implementations of RF transceivers, such as the RF transceiver 20 of FIG. 2, according to various embodiments described herein. Similar reference numbering is used for added clarity. Turning to FIG. 6, an RF transceiver 60 is shown, which can represent a simplified implementation or illustration of the RF transceiver 20 circuit of FIG. 2. As described above with reference at least to FIG. 2, transceiver 60 can include a receive path 21, a first RF transmit path 22, and a second RF transmit path 23. Embodiments can also include logic circuits and/or other components, which are not explicitly shown. Receive path 21, first RF transmit path 22, and second transmit path 23 are connected to each other by a main signal path 200 that may terminate at a node 201. Node 201 may be a pin, pad, or bump of an integrated circuit. For example, implementations of the RF transceiver 60 can be coupled with an external (off-chip) antenna via an external matching network, or the like.

Receive path 21 may include a low noise amplifier (LNA) 211 configured to receive a RF input signal (e.g., via an antenna). The receive path 21 can also include an LNA impedance matching inductor 214. An input to the LNA 211 can be selectively coupled to a ground reference via a first switch S1. As described above, though not shown, embodiments can also include various coupling capacitors, DC blocking capacitors, DC bias circuits, etc.

The first RF transmit path 22 can include a low power amplifier (LP AMP) 221, such as an amplifier configured for use with BLE implementations. LP AMP 221 can receive a first RF input signal t1 and provide an amplified output signal. The output of LP AMP 221 can be coupled with the main signal path 200 via a second switch S2 and a DC block capacitor. Embodiments of the first RF transmit path 22 also include a DC bias circuit 225 coupled with second switch S2 and configured to provide a DC bias voltage to the output signal when second switch S2 is in a closed position. The bias voltage can be blocked by the DC block capacitor in the path so that only the output signal reaches the main signal path 200. The DC bias circuit 225 can be coupled with second switch S2 via a fourth switch S4 and a resistor, or in any other suitable manner. Alternatively, LP AMP 221 can have an internal bias voltage or current, and DC bias circuit 225 can be omitted.

The second RF transmit path 23 can include a high power amplifier (HP AMP) 231 and a balun 235 having primary and secondary windings. In some implementations, HP AMP 231 is an amplifier configured for use with higher-power Bluetooth (e.g., as compared to BLE) communications). HP AMP 231 is configured to receive a signal t2 and output an amplified differential output signal to balun 235. In the balun 235, the secondary winding is electromagnetically coupled to the primary winding, one end of the secondary winding is coupled with the main signal path 200, and the other end of the secondary winding is coupled with a ground reference through a third switch S3. Balun 235 is configured to convert the differential output signal from HP AMP 231 to a single-ended signal, for use by a single-tap antenna (e.g., via node 201), or the like.

As described above, RF transceiver 60 can operate in different operating modes. For example, different configurations of switches S1, S2, S3, and S4 can be used to reconfigure the RF transceiver 60 for such operating modes. For example, in a receive mode, at least switches S1 and S2 are turned off (deactivated, set as open circuits, etc.). S3 can also be turned off to reduce losses associated with the balun 235 load, and/or S4 can also be turned off (as long as there are no large swings at the antenna). In a low-power transmit mode (e.g., a BLE transmit mode, such as a 7 decibel-milliwatts (dBm) mode), switches S1 and S2 are turned on (activated, set as closed circuits, etc.). Turning on switch S1 can help with detuning the receive path 21 (with the LNA 211 and the inductor 214) to reduce loading and losses. Switch S3 can be off to reduce losses associated with the balun 235 load, and/or switch S4 can be turned off (e.g., switch S4 may be off whenever switch S2 is on). In a high-power transmit mode (e.g., a Bluetooth transmit mode, such as a 13 dBm mode), switches S1 and S3 are turned on. Turning on switch S1 can help protect the LNA 211. Switch S2 can be off to help protect the LP AMP 221, in which case it can be desirable to turn on S4 (e.g., turning on S4 can effectively pull the gate of S2 to ground, which can help ensure that the drain voltage of S2 stays above its gate voltage).

Figure 7:
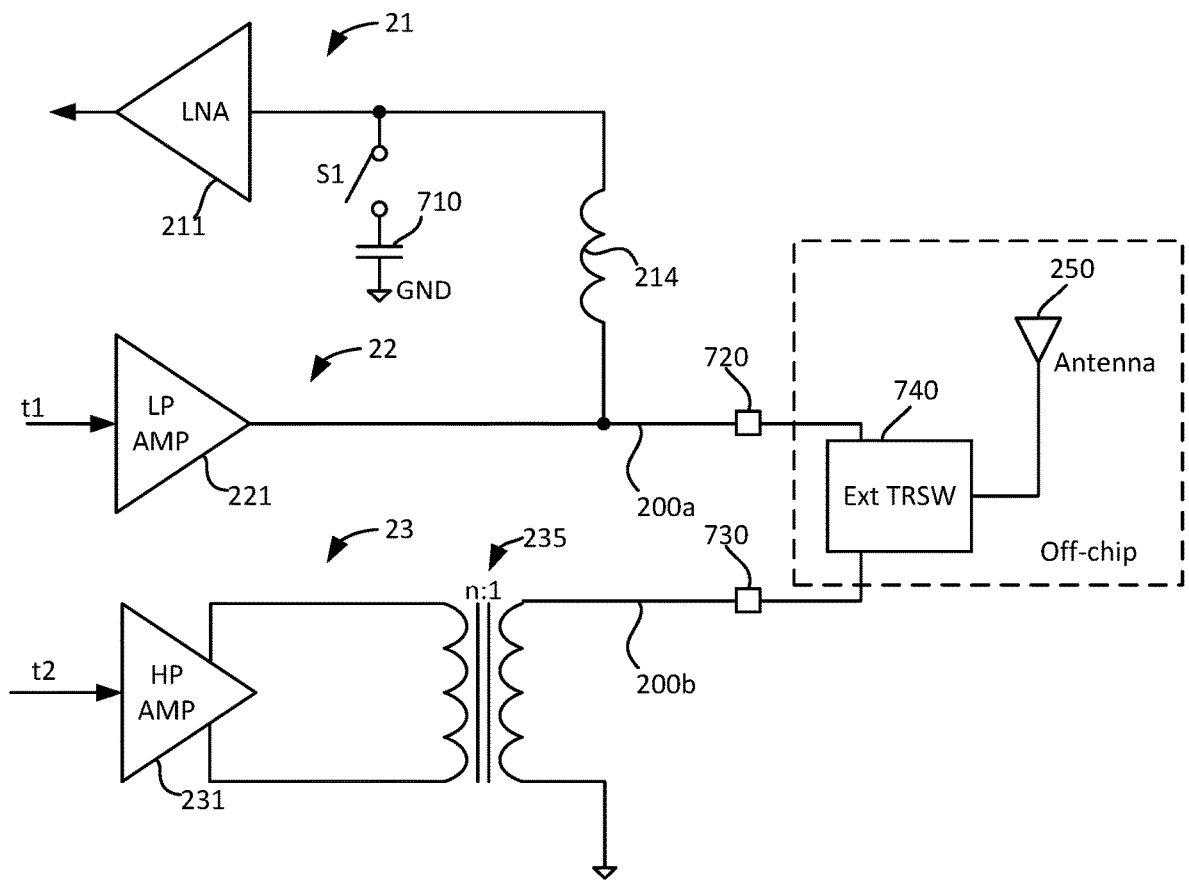
FIG. 7 shows another implementation of an RF transceiver, which can represent another simplified implementation or illustration of the RF transceiver circuit of FIG. 2, or FIG. 6.

FIG. 7 shows another implementation of an RF transceiver 70, which can represent another simplified implementation or illustration of the RF transceiver 20 circuit of FIG. 2, or RF transceiver 60 of FIG. 6. In the illustrated implementation of FIG. 7, switch S1 is maintained on-chip with the RF transceiver 70, and some or all other switching can be moved off-chip. For example, the main signal path 200 is split: The receive path 21 and the first RF transmit path 22 are coupled with a first main signal path 200a coupled with a first node 720; and the second RF transmit path 23 is coupled with a second main signal path 200b coupled with a second node 730.

For reference and context, illustrative off-chip components are shown coupled with the first node 720 and the second node 730. In particular, an external set of switches 740 and/or other components (e.g., matching networks, etc.) can be coupled with an antenna 250 off-chip. Such off-chip switching can facilitate operating LP AMP 221 and HP AMP 231 in higher efficiency modes without appreciably impacting the operation of the RF transceiver 70. In some implementations, the external set of switches 740 includes switches S2 and S3 to support selecting, along with switch S1, between the receive mode, the low-power transmit mode, and the high-power transmit mode. For example, in the receive mode, switch S1 can be off. In the low-power transmit mode, switch S1 can be on. As illustrated, a capacitor can be added in the path of switch S1 to help block ground from the LP AMP 221 DC in this operating mode. In the high-power transmit mode, the external switches 740 can be used to enable the second RF transmit path 23, while also protecting the LNA 211 and/or LP AMP 221. Switch S1 can also be on or off, such as to further protect the LNA 211, depending on the configuration of the external switches 740.

Figure 8:
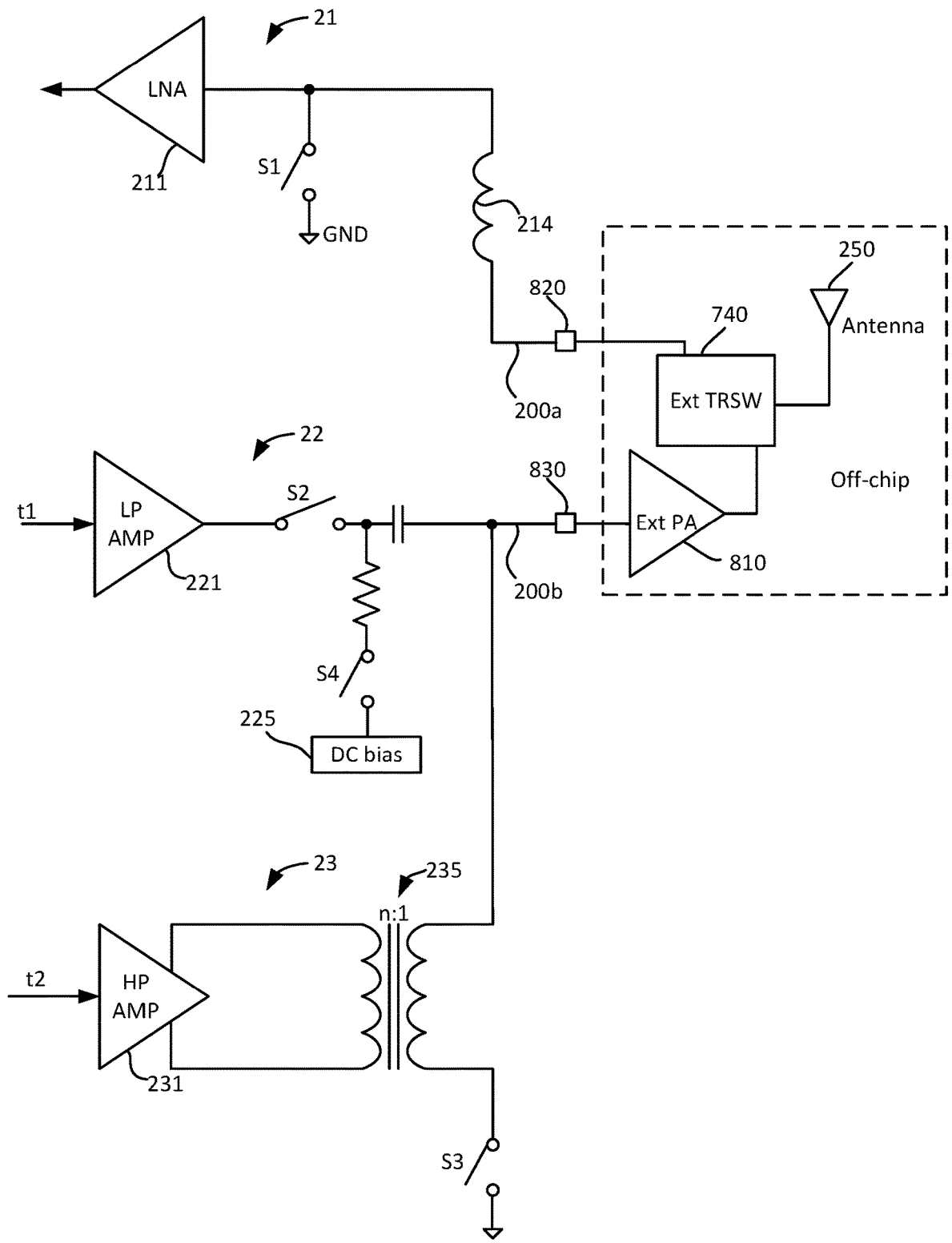
FIG. 8 shows another implementation of an RF transceiver to support a very-high-power operating mode.

FIG. 8 shows another implementation of an RF transceiver 80 to support a very-high-power operating mode. The illustrated circuit can be an implementation or illustration of the RF transceiver 20 circuit of FIG. 2, or other RF circuits described herein. For example, the illustrated implementation of FIG. 8 is shown as similar to that of FIG. 6, except that a separate node is added for coupling to the receive path 21. For example, the main signal path 200 is split: The receive path 21 is coupled with a first main signal path 200a coupled with a first node 820; and the first RF transmit path 22 and the second RF transmit path 23 is coupled with a second main signal path 200b coupled with a second node 830.

For reference and context, illustrative off-chip components are shown coupled with the first node 820 and the second node 830. As in FIG. 7, the off-chip components can include an external set of switches 740 and/or other components (e.g., matching networks, etc.) coupled with an antenna 250. In FIG. 8, the off-chip components can further include an external power amplifier 810, which can support a very high power operating mode. Separation of the LNA 211 via the external switches 740 can help minimize the impact of this configuration on performance of the RF transceiver in other operating modes, such as in receive mode.

Figure 9:
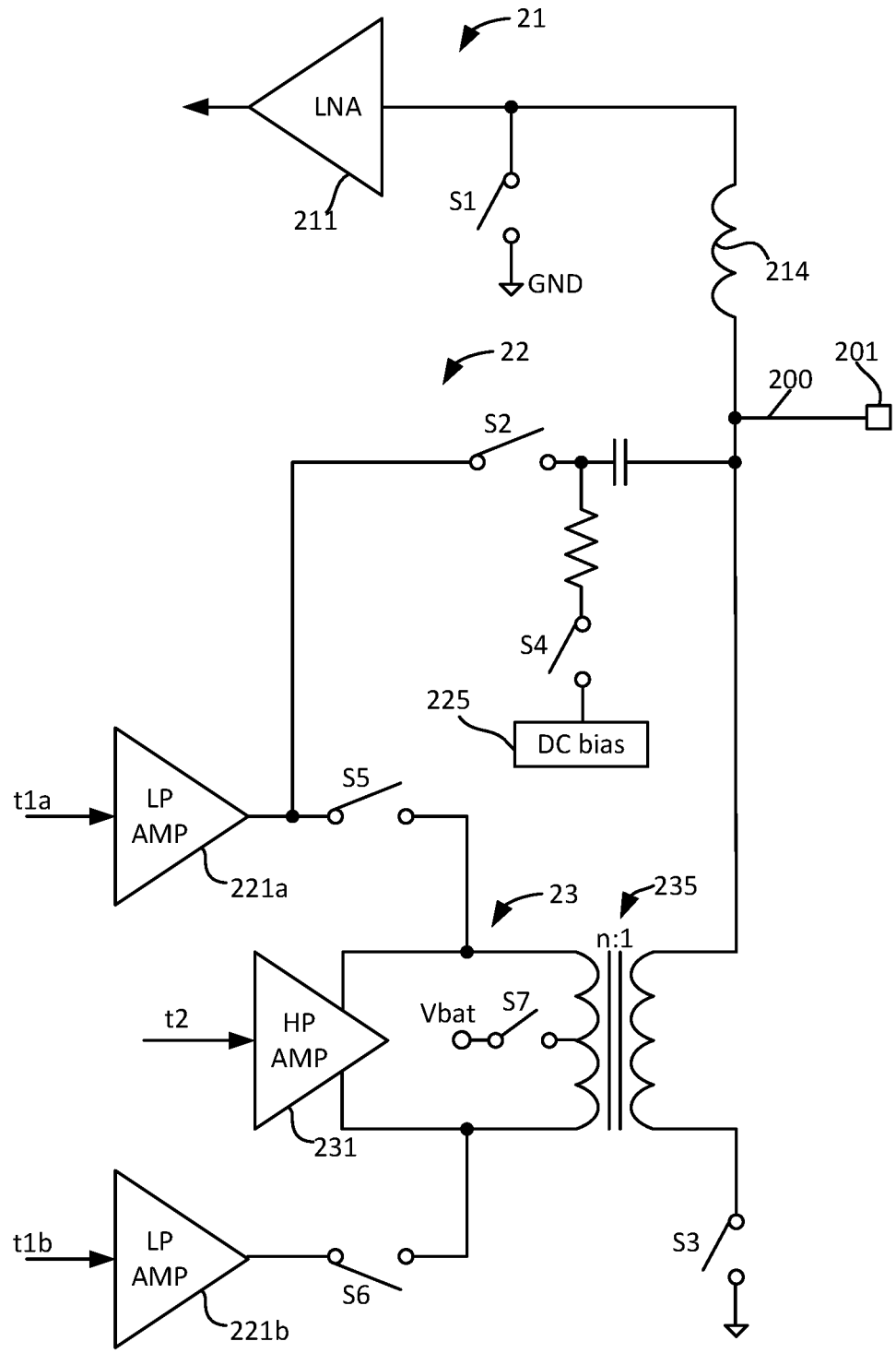
FIG. 9 shows another RF transceiver to support a differential low-power transmit mode and/or a medium-power transmit mode.

FIG. 9 shows another RF transceiver 90 to support a differential low-power transmit mode and/or a medium-power transmit mode. The illustrated circuit can be an implementation or illustration of the RF transceiver 20 circuit of FIG. 2, or other RF circuits described herein. For example, components are shown and labeled similar to those in the RF transceiver 60 of FIG. 6 to support at least a receive path 21, a first RF transmit path 22, and a second RF transmit path 23. The various paths are connected to each other by a main signal path 200 that may terminate at a node 201 (e.g., for coupling with off-chip components). The receive path 21 and the second RF transmit path 23 are shown as substantially identical to those of FIG. 6.

As illustrated, with reference to the first RF transmit path 22, the LP AMP 221 described in various embodiments above can be implemented as multiple amplifiers (shown as LP AMP 221a and LP AMP 221b) to facilitate receipt of a differential RF input signal t1 (shown as signals t1a and t1b). The output of a first LP AMP 221a is coupled with the main signal path 200 via switch S2, substantially as described with reference to FIG. 6. The same output can also be coupled with one side of the primary winding of the balun 235 via a fifth switch S5. The output of a second LP AMP 221b is coupled with the other side of the primary winding of the balun 235 via a sixth switch S6. As described with reference to FIG. 2, the primary winding of the balun 235 can have a tap connected to a power supply Vbat. In the illustrated embodiment, the Vbat supply can be coupled with the primary winding via a seventh switch S7.

As described above, RF transceiver 80 can operate in different operating modes, for example, according to different configurations of switches S1-S7. The receive mode, low-power transmit mode, and high-power transmit mode, can operate substantially as described with reference to FIG. 6 (and preceding figures). For example, in a receive mode, all the switches (S1-S7) can be turned off (or switch S4 can be turned on in some cases, as noted above). In a low-power transmit mode (e.g., a single-ended BLE transmit mode), switches S1 and S2 are turned on, and some or all other switches are turned off. In a high-power transmit mode, switches S1 and S3 are turned on, and switches S2, S5, and S6 can be turned off. Switch S4 can be turned on in the high-power transmit mode, as described above. In the high-power transmit mode, Vbat can also be coupled to the primary winding of the balun 235 by turning on switch S7.

The illustrated embodiment also supports a medium-power transmit mode (e.g., a double-ended, or differential, BLE transmit mode). In such a mode, switches S1, S3, S5, and S6 can be turned on; and switches S2 and S7 can be turned off. Switch S4 can also be turned on to mitigate concerns that can arise from having S2 turned off. In com implementations of the medium-power transmit mode, the HP AMP 231 (e.g., linear or switching amplifier) is turned off to operate the second differential LP AMP 221b (e.g. which can also be a linear or switching amplifier, operated from a different supply). Such a configuration can provide medium power transmission at high efficiency. In this mode, turning off S7 can effectively isolate Vbat from the balun 235, thereby allowing the LP AMPs 221 to use their own supply voltage.

In FIG. 9, it can be seen that, in low-power transmit mode, LP AMP 221a directly drives the load impedance. In the medium-power transmit (differential) mode, two instances of the LP AMP 221 are using a same supply, such that twice the current can be delivered. To maintain substantially the same efficiency at the same supply voltage, it can be desirable for each side (e.g., LP AMP 221a and LP AMP 221b) to see half the load impedance, achieved through the balun 235. Such can be achieved by changing the transformation (turns) ratio of the balun 235 to present lower impedance to the LP AMP 221, while also increasing the LP AMP 221 size/current to provide high power. Conventionally, baluns tend to be configured with a fixed turns ratio. However, some embodiments herein can include a reconfigurable balun 235. For example, on-chip switches are used to reconfigure the balun's 235 turn ratio in certain operating modes.

Figure 10:
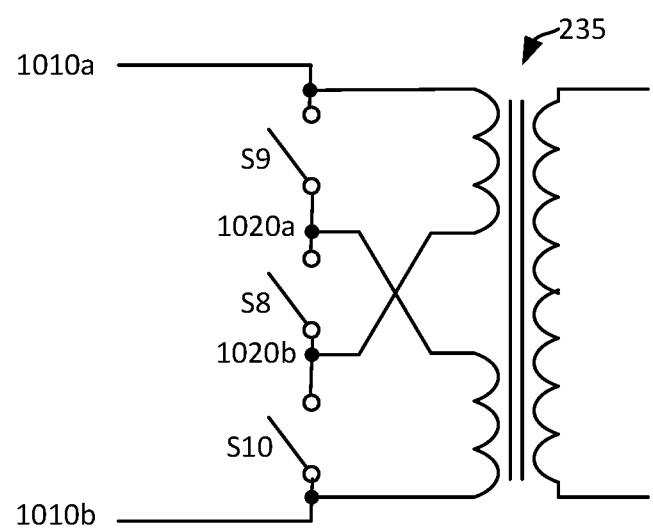
FIG. 10 shows an illustrative reconfigurable balun circuit for use with embodiments of RF transceivers described herein, such as the RF transceiver of FIG. 9.

FIG. 10 shows an illustrative reconfigurable balun circuit 100 for use with embodiments of RF transceivers described herein, such as the RF transceiver 90 of FIG. 9. The illustrated reconfigurable balun circuit 100 includes a balun 235 and a number of switches S8, S9, and S10. The primary winding of the balun 235 is coupled between differential primary inputs 1010a, 1010b, and the primary winding is split into first and second portions. Switch S9 is coupled between a first primary input 1010a and a first intermediate node 1020a. Switch S10 is coupled between a second primary input 1010b and a second intermediate node 1020b. Switch S8 is coupled between the first intermediate node 1020a and the second intermediate node 1020b. A first portion of the primary winding is coupled across switch S9 (i.e., between the first primary input 1010a and the first intermediate node 1020a), and a second portion of the primary winding is coupled across switch S10 (i.e., between the second primary input 1010b and the second intermediate node 1020b).

In a first configuration (e.g., a normal balun mode), switch S8 is turned on, and switches S9 and S10 are turned off. It can be seen that this effectively couples the two primary inductors in series. For example, the secondary to primary turns ratio can be n:2 in this configuration. In a second configuration (e.g., a high-power mode), switch S8 is turned off, and switches S9 and S10 are turned on. It can be seen that this effectively couples the two primary inductors in parallel. For example, the secondary to primary turns ratio can be n:1 in this configuration.

Although specific embodiments have been illustrated and described herein, it will be appreciated by those of ordinary skill in the art that any arrangement that is derived to achieve the same purpose may be substituted for the specific embodiments shown. Many modifications of the invention will be apparent to those of ordinary skill in the art. Accordingly, this disclosure is intended to cover any modifications or variations of the invention. It is intended that this invention be limited only by the following claims and their equivalents.

What is claimed is:

1. A transceiver comprising:
a receive path coupled with an antenna interface configured to couple with an off-chip antenna, the receive path selectively coupled with a ground reference via a first switch;
a first transmit path including a low power amplifier (LPA) having a LPA output selectively coupled with the antenna interface via a second switch and a DC blocking capacitor; and
a second transmit path including a high power amplifier (HPA) coupled with a primary winding of a balun having a secondary winding inductively coupled with the primary winding, a first side of the secondary winding coupled with the antenna interface, and a second side of the secondary winding coupled with the ground reference, the secondary winding selectively activated via a third switch,
wherein a receive mode is active when the first switch is deactivated, the second switch is deactivated, and the third switch is deactivated,
wherein a low-power transmit mode is active when the first switch is activated, the second switch is activated, and the third switch is deactivated, and
wherein a high-power transmit mode is active when the first switch is activated, the second switch is deactivated, and the third switch is activated.

2. The transceiver of claim 1, further comprising:
a logic circuit selectively to reconfigure between the receive mode, the low-power transmit mode, and the high-power transmit mode by generating control signals selectively to activate or deactivate at least the first, second, and third switches.

3. The transceiver of claim 1, wherein:
the LPA output is further selectively coupled with a DC bias circuit via a fourth switch; and
the fourth switch is activated at least when the high-power transmit mode is active.

4. The transceiver of claim 1, wherein:
the receive path has a low-noise amplifier (LNA), an input of the LNA being coupled with the off-chip antenna interface, and selectively coupled with the ground reference via the first switch.

5. The transceiver of claim 1, wherein:
the receive path, the LPA, the HPA, the balun, and the antenna interface are disposed on an integrated circuit chip;
the receive path further comprises a capacitor coupled between the ground reference and the first switch;
the receive path and the output of the LPA are coupled with a first node of the antenna interface;
the first side of the secondary winding coupled with a second node of the antenna interface separate from the first node of the antenna interface; and
the second switch, the DC blocking capacitor, and the third switch are disposed in an off-chip component coupled with the first and second nodes of the antenna interface.

6. The transceiver of claim 1, wherein:
the receive path, the first transmit path, the second transmit path, and the antenna interface are disposed on an integrated circuit chip;
the receive path is coupled with a first node of the antenna interface;
the first transmit path and the second transmit path are coupled with a second node of the antenna interface separate from the first node of the antenna interface.

7. The transceiver of claim 6, further comprising:
an off-chip power amplifier having an input coupled with the second node of the antenna interface and an output configured to couple with the off-chip antenna.

8. The transceiver of claim 1, wherein:
the LPA comprises a first LPA and a second LPA;
the first LPA has a first LPA output selectively coupled with the antenna interface via the second switch and the DC blocking capacitor, and selectively coupled with a first side of the primary winding of the balun via a fourth switch;
the second LPA has a second LPA output selectively coupled with a second side of the primary winding of the balun via a fifth switch.

9. The transceiver of claim 8, wherein:
the low-power transmit mode is active when the first switch is activated, the second switch is activated, the third switch is deactivated, the fourth switch is deactivated, and the fifth switch is deactivated;
a medium-power transmit mode is active when the first switch is activated, the second switch is deactivated, the third switch is activated, the fourth switch is activated, and the fifth switch is activated.

10. The transceiver of claim 9, wherein, in the medium-power transmit mode, the first LPA and the second LPA are configured to receive a differential input signal.

11. The transceiver of claim 8, further comprising:
a battery voltage reference node coupled with a center tap on the primary winding of the balun via a sixth switch,
wherein the sixth switch is deactivated in the receive mode, the sixth switch is deactivated in the low-power transmit mode, and the sixth switch is activated in the high-power transmit mode.

12. The transceiver of claim 8, further comprising:
a sixth switch, a seventh switch, and an eighth switch, wherein:
the primary winding of the balun comprises a first primary winding and a second primary winding, both inductively coupled with the secondary winding,
the first side of the primary winding corresponding to a first side of the first primary winding, and the second side of the primary winding corresponding to a second side of the second primary winding,
the sixth switch is coupled between a second side of the first primary winding and a first side of the second primary winding,
the seventh switch is coupled between the first side of the first primary winding and the first side of the second primary winding,
the eighth switch is coupled between the second side of the first primary winding and the second side of the second primary winding,
the balun is configurable to operate in a normal mode by activating the sixth switch, deactivating the seventh switch, and deactivating the eighth switch, such that the first and second primary windings are connected in series, and
the balun is configurable to operate in a high-power mode by deactivating the sixth switch, activating the seventh switch, and activating the eighth switch, such that the first and second primary windings are connected in parallel.

13. A method of operating a transceiver comprising an antenna interface configured to couple with an off-chip antenna, a receive path coupled with the antenna interface and selectively coupled with a ground reference via a first switch, a first transmit path including a low power amplifier (LPA) having a LPA output selectively coupled with the antenna interface via a second switch and a DC blocking capacitor, and a second transmit path including a high power amplifier (HPA) coupled with a primary winding of a balun having a secondary winding inductively coupled with the primary winding, a first side of the secondary winding coupled with the antenna interface, and a second side of the secondary winding coupled with the ground reference, the secondary winding selectively activated via a third switch, the method comprising:
configuring the transceiver to operate in a selected one of a plurality of operating modes by generating control signals to selectively activate or deactivate each of the first switch, the second switch, and the third switch, such that:
the transceiver is configured to operate in a receive mode of the plurality of operating modes by generating the control signals to deactivate the first switch, to deactivate the second switch, and to deactivate the third switch;
the transceiver is configured to operate in a low-power transmit mode of the plurality of operating modes by generating the control signals to activate the first switch, to activate the second switch, and to deactivate the third switch; and
the transceiver is configured to operate in a high-power transmit mode of the plurality of operating modes by generating the control signals to activate the first switch, to deactivate the second switch, and to deactivate the third switch.

14. The method of claim 13, wherein:
the LPA output is further selectively coupled with a DC bias circuit via a fourth switch; and
the transceiver is configured to operate in the high-power transmit mode of the plurality of operating modes by generating the control signals further to activate the fourth switch.

15. The method of claim 13, wherein:
the receive path is coupled with a first node of the antenna interface;
the first transmit path and the second transmit path are coupled with a second node of the antenna interface separate from the first node of the antenna interface by at least a set of off-chip switches;
the transceiver further includes an off-chip power amplifier having an input coupled with the second node of the antenna interface and an output configured to couple with the off-chip antenna; and
the configuring is, such that the transceiver is further configured to operate in a very-high-power transmit mode of the plurality of operating modes by generating the control signals to activate the first switch, to deactivate the second switch, and to deactivate the third switch, and to activate the off-chip power amplifier.

16. The method of claim 13, wherein:

the LPA comprises a first LPA and a second LPA;

the first LPA has a first LPA output selectively coupled with the antenna interface via the second switch and the DC blocking capacitor, and selectively coupled with a first side of the primary winding of the balun via a fourth switch;

the second LPA has a second LPA output selectively coupled with a second side of the primary winding of the balun via a fifth switch; and the transceiver is configured to operate in the low-power transmit mode of the plurality of operating modes by generating the control signals to activate the first switch, to activate the second switch, to deactivate the third switch, to deactivate the fourth switch, and to deactivate the fifth switch.

17. The method of claim 16, wherein:

the configuring is, such that the transceiver is further configured to operate in a medium-power transmit mode of the plurality of operating modes by generating the control signals to activate the first switch, to deactivate the second switch, to activate the third switch, to activate the fourth switch, and to activate the fifth switch.

18. The method of claim 17, wherein, in the medium-power transmit mode, the first LPA and the second LPA are configured to receive a differential input signal.

19. The method of claim 16, wherein:

the transceiver further comprises a battery voltage reference node coupled with a center tap on the primary winding of the balun via a sixth switch; and the configuring is such that the sixth switch is deactivated in the receive mode, the sixth switch is deactivated in the low-power transmit mode, and the sixth switch is activated in the high-power transmit mode.

20. The method of claim 16, further comprising:

selectively configuring the balun to operate in one of a normal mode or a high-power mode, wherein:

the primary winding of the balun comprises a first primary winding and a second primary winding, both inductively coupled with the secondary winding;

selectively configuring the balun to operate in the normal mode comprises switchably coupling the first and second primary windings to be connected in series; and selectively configuring the balun to operate in the high-power mode comprises switchably coupling the first and second primary windings to be connected in parallel.

* * * * *